(12) United States Patent
Chang (10) Patent No.: US 6,193,524 B1
(45) Date of Patent: Feb. 27, 2001

(54) CONNECTOR WITH HIGH-DENSELY ARRANGED TERMINALS FOR CONNECTING TO WORKING ELEMENT AND PRINTED CIRCUIT BOARD THROUGH LGA TYPE CONNECTION

(75) Inventor: Pierce Chang, Taipei Hsien (TW)

(73) Assignee: Tekon Electronics Corp., Taipei Hsien (TW)

( * ) Notice: Subject to any disclaimer, the term of this patent is extended or adjusted under 35 U.S.C. 154(b) by 0 days.

(21) Appl. No.: 09/377,876

(22) Filed: Aug. 20, 1999

(51) Int. Cl.$^7$ .................................................. H01R 12/00
(52) U.S. Cl. ................................................ 439/66; 439/71
(58) Field of Search ................................ 439/66, 70, 71, 439/591, 862

(56) References Cited

U.S. PATENT DOCUMENTS

| | | | |
|---|---|---|---|
| 4,161,346 | * 7/1979 | Cherian et al. | 439/66 |
| 5,573,435 | * 11/1996 | Grabbe et al. | 439/66 |
| 5,791,914 | * 8/1998 | Loranger et al. | 439/66 |
| 5,800,184 | * 9/1998 | Lopergolo et al. | 439/66 |
| 5,957,703 | * 9/1999 | Arai et al. | 439/66 |

* cited by examiner

Primary Examiner—T. C. Patel
(74) Attorney, Agent, or Firm—Smith, Gambrell & Russell, LLP (57) ABSTRACT

A connector of which the terminals are staggering arranged so that each terminal is closely surrounded by another six terminals to enable an increased density of terminals in one unit area. Each of the terminals of the connector includes an upper and a lower elastic portion for respectively connecting to contacts of a working element and a printed circuit board assembled to the connector. Two forward pressures in opposite directions are applied by the working element and the printed circuit board on the connector to cause the upper and the lower elastic portions of the terminals to electrically connect to the contacts on the working element and the printed circuit board. No tin soldering is required in the assembling of the working element and the printed circuit board to the connector. And, the elastic portions of the terminal may be differently shaped.

6 Claims, 7 Drawing Sheets

CONNECTOR WITH HIGH-DENSELY ARRANGED TERMINALS FOR CONNECTING TO WORKING ELEMENT AND PRINTED CIRCUIT BOARD THROUGH LGA TYPE CONNECTION

FIELD OF THE INVENTION

The present invention relates to a connector, and more particularly to a connector having high densely arranged terminals to electrically connect to contacts on working element and printed circuit board through LGA (Leadless Grid Array) type connection.

BACKGROUND OF THE INVENTION

Figure 1:
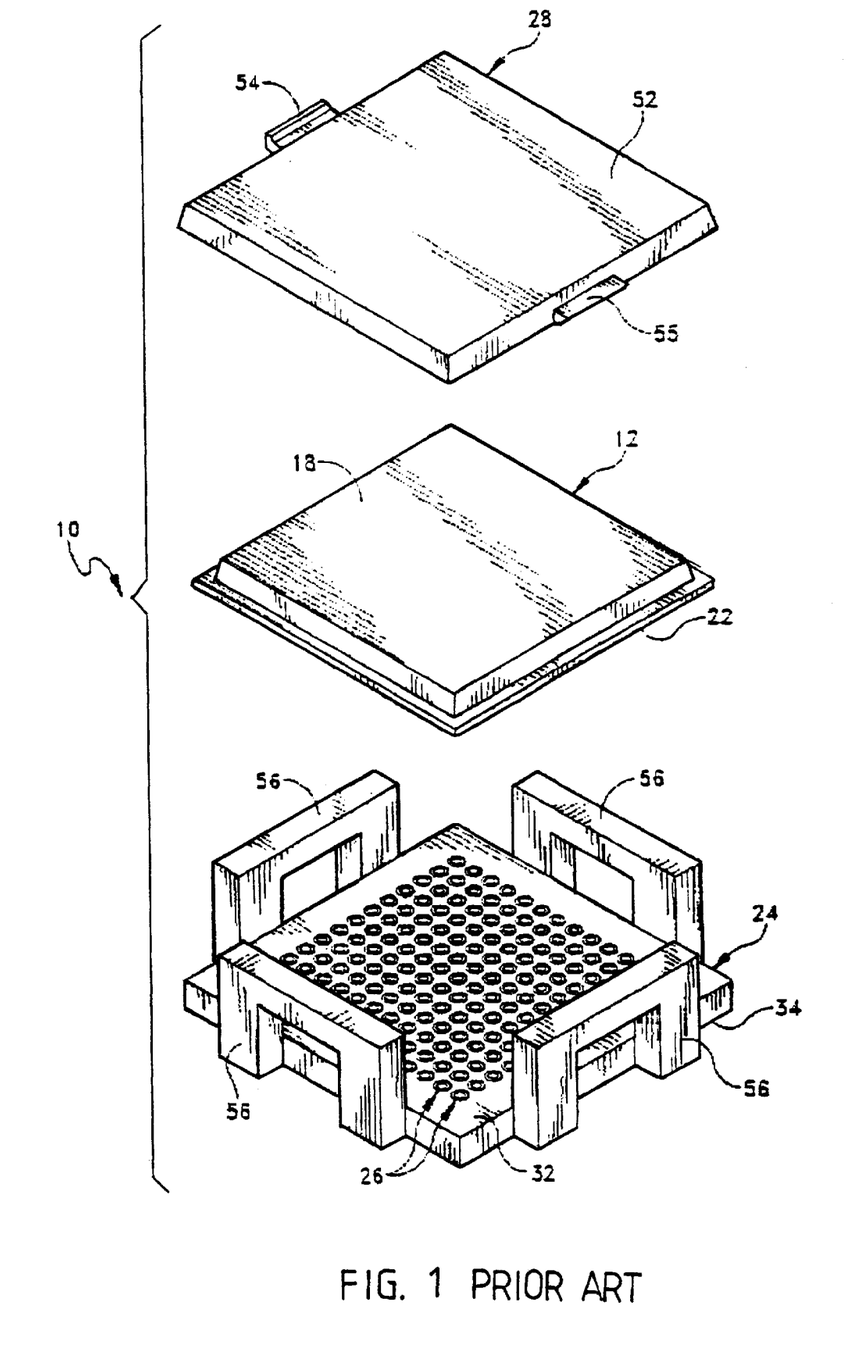
FIG. 1 is an exploded perspective of a BGA type connector according to a prior art.
Figure 2:
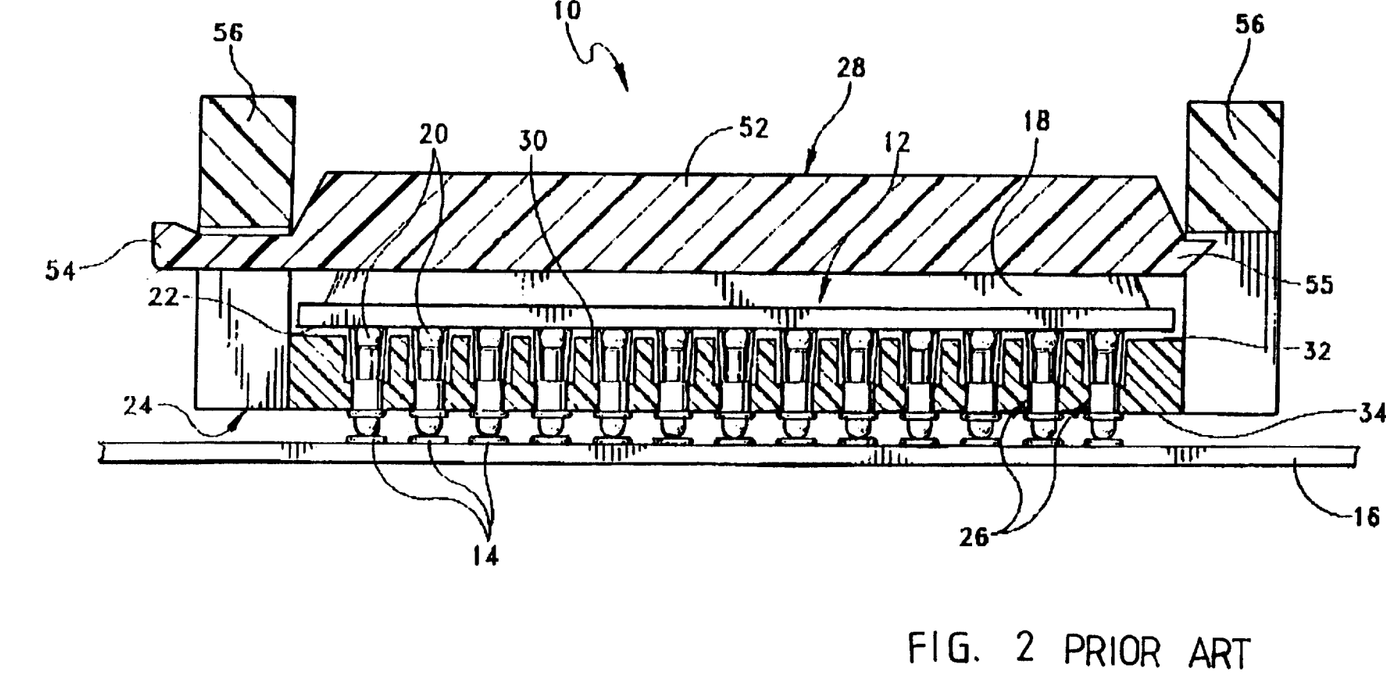
FIG. 2 is vertical sectional view of the BGA type connector of FIG. 1.

FIGS. 1 and 2 illustrate an IC structure disclosed in U.S. Pat. No. 5,702,255. The IC structure includes a cover 28, a BGA (ball grid array) package 12 having semiconductor elements provided therein, and a connector main body 24. From FIG. 2, it can be clearly seen that the BGA package 12 has ball-type contacts 20 that are connected to contact assemblies 26 provided on the connector main body 24. The contact assemblies 26 have ball-shaped lower ends that are in contact with terminal pads 14 provided on a circuit board 16. This is the so-called BGA type connection that is considered to be superior to the conventional SMT type connection.

Figure 3:
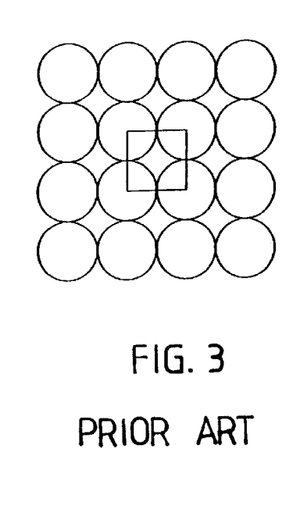
FIG. 3 schematically shows a conventional arrangement of connector pins in straight rows.

There are different ways of arrangement of pins on a connector. The arrangement of pins disclosed in the above-mentioned U.S. Pat. No. 5,702,255 is shown in FIG. 3, in which the pins are arranged in multiple longitudinal and transverse rows. That is, each circle in FIG. 3 represents a position for one single pin, and each pin position has another four pin positions separately arranged at its front, rear, right, and left sides. A rate of use in one unit area provided by this type of arrangement of pins is 0.7854.

Figure 4:
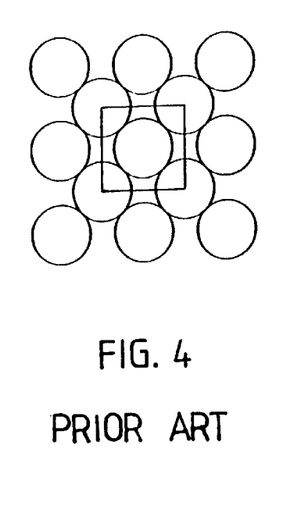
FIG. 4 schematically shows another conventional arrangement of connector pins in intersecting diagonal lines.

FIG. 4 shows another type of pin arrangement that is currently adopted in most conventional connectors. In this type of arrangement, pins are located on intersecting lines. That is, each pin position represented by a circle has another four pin positions spaced around it on two intersecting diagonal lines. The rate of use in one unit area provided by this type of pin arrangement is 0.7854 that is not good enough and needs improvement.

Currently, there is another LGA (Leadless Grid Array) type of connection widely adopted to connect working elements to a connector. The LGA type of connection is different from and superior to the conventional SMT and BGA types of connection in that it does not require any tin soldering. Working elements are electrically connected to the connector by forward contact with terminals in the connector. The LGA type of connection simplifies the connection in an IC structure and enables largely improved good yield of connection. Moreover, components employed in the BGA type connector can be applied to the connector adopting LGA type connection.

Figure 10A:
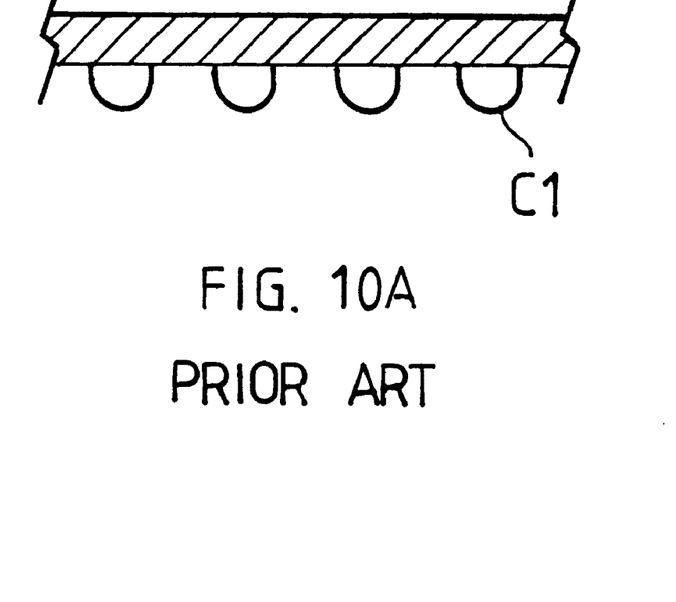
FIG. 10A shows the ball-type contacts on a working element for connecting to the LGA type connector of the present invention.
Figure 10B:
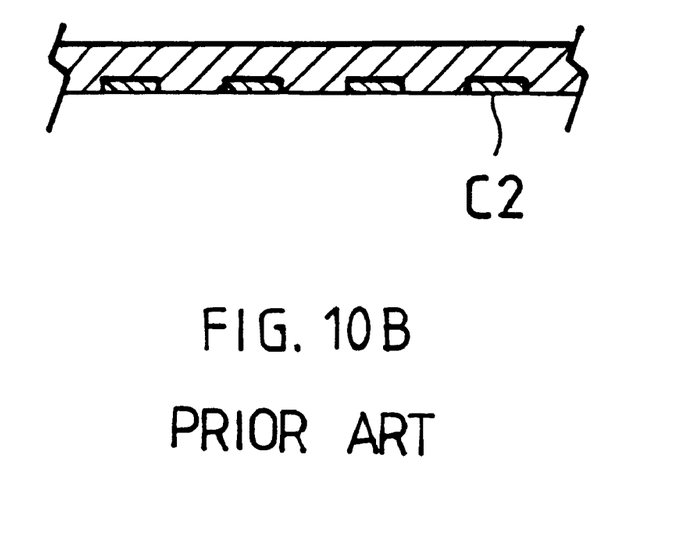
FIG. 10B shows the plane-type contacts on a working element for connecting to the LGA type connector of the present invention.

To achieve the LGA type connection, the working elements may have two different types of contacts, namely, a ball type contact C1 and a plane type contact C2, as illustrated in FIGS. 10A and 10B, respectively. Both the ball and the plane type contacts are connected to the terminals on the connector without using tin soldering.

SUMMARY OF THE INVENTION

A primary object of the present invention is to provide a connector with high-densely arranged terminals. Pin positions of the connector are densely arranged in a staggered pattern to achieve an improved rate of use in one unit area up to 0.9069. And distances among individual pins can be increased to reduce noise, so that the connector could be used with a high-frequency working element. The connector with staggered terminals may be applied to general computer elements and to connect to a printed circuit board.

Another object of the present invention is to provide a connector with LGA type terminals. The terminals have upper and lower elastic portions that will tightly connect to contacts on working element and printed circuit board under forward pressures applied on the connector by the working element and the printed circuit board. And, both the upper and the lower elastic portions of the LGA type terminals may be differently shaped into either two dimension or three dimensions depending on actual needs.

BRIEF DESCRIPTION OF THE DRAWINGS

The structural features and the functions of the present invention can be best understood by referring to the following detailed description of the preferred embodiments and the accompanying drawings, wherein.

DETAILED DESCRIPTION OF THE PREFERRED EMBODIMENTS

The present invention provides two major improvements on a connector used in an IC structure. One of these improvements is concerned with the arrangement of pins on the connector, and the other with the shape of terminals on the connector.

Figure 5:
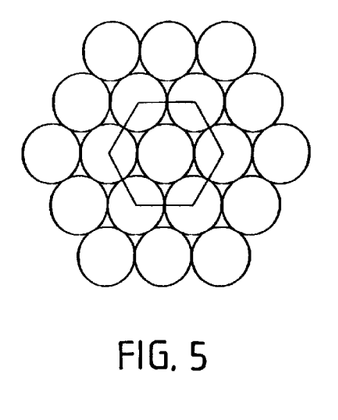
FIG. 5 schematically shows a staggered arrangement of connector pins according to the present invention.
Figure 5A:
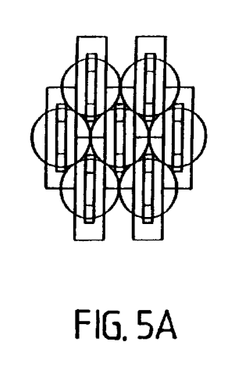
FIG. 5A schematically shows a practical application of the pin arrangement of the present invention.

Please refer to FIG. 5 that schematically shows the arrangement of pins on the connector according to the present invention. Each circle in the figure represents one pin position. As can be clearly seen from FIG. 5, the circles are arranged in a staggered pattern. That is, each pin of the connector has another six identical pins closely arranged around it. From FIG. 5A, it can be found by calculation that a rate of use in one unit area provided by this type of pin arrangement is 0.9069 that is much higher than that could be provided by other conventional arrangements of pins. That is, this staggered pattern of arrangement of pins allows the highest number of pins possible in one unit area. For example, given the number of required pins is 400 and a pin pitch thereof is 1.27, a calculated area for the 400 required pins is 580 mm$^2$. A reduced volume occupied by pins can therefore be achieved. For some computer equipment that require as small volume as possible, such as a notebook computer, this stagger type of pin arrangement is obviously more advantageous for use.

By arranging the pins in the staggered pattern, either an increased density of pins within one unit area or an increased distance among pins can be achieved to reduce noise, so that the connector can be used with a high-frequency central processing unit.

The connector with staggered pins according to the present invention can adopt the LGA (Leadless Grid Array) connection and be used with working elements such as a central processing unit. More details about an LGA type connector will be described below.

Figure 6A:
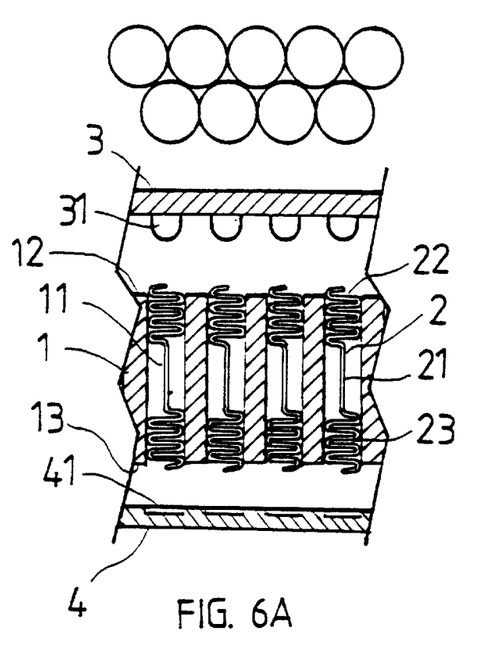
FIG. 6A is a fragmentary side sectional view of the connector of the present invention before working element and printed circuit board are connected thereto.

Please refer to FIG. 6A. The connector according to the present invention includes a plastic body 1 formed of a plurality of terminal holes 11 for each receiving a terminal 2 therein. The terminal 2 each includes a middle base 21, an upper elastic portion 22, and a lower elastic portion 23. The lower elastic portion 23 downward extends through a bottom 13 of the plastic body 1 to connect to a contact 41 on a circuit board 4, and the upper elastic portion 22 slightly upward projects from a top 12 of the plastic body 1 to connect to a contact 31 on a working element 3.

The circles shown at an upper part of FIG. 6A represent positions for individual pins or terminals 2 on the connector. Before the working element 3 and the printed circuit board 4 are connected to the connector, as shown in FIG. 6A, the upper elastic portions 22 of the terminals 2 slightly project from the top 12 of the plastic body 1, and the lower elastic portions 23 of the terminals 2 slightly project from the bottom 13 of the plastic body 1. The slight projection of the elastic portions 22, 23 from the plastic body 1 increases the forward pressures applied by contacts 31 and 41 on the working element 3 and the printed circuit board 4, respectively, on the elastic portions 22 and 23 when the working element 3 and the printed circuit board 4 are assembled to the connector. Therefore, a precise and stable connection of the working element 3 and the printed circuit board 4 to the connector 1 can be ensured.

Figure 6B:
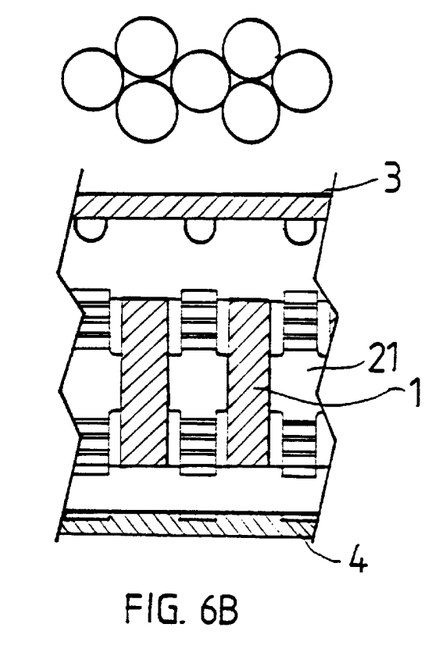
FIG. 6B is a fragmentary front sectional view of the same connector of FIG. 6A.

FIG. 6B is similar to FIG. 6A but is viewed from another direction of the connector 1.

Figure 7A:
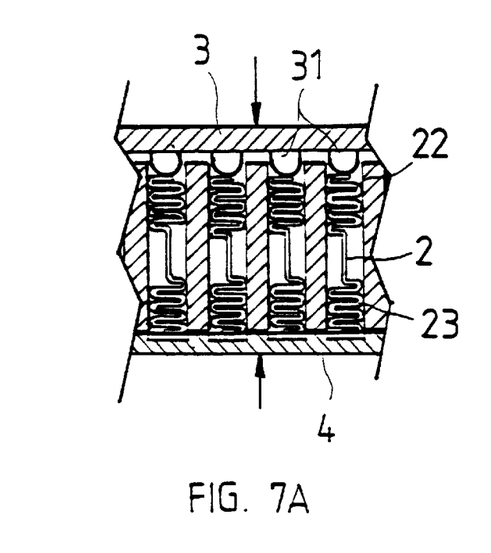
FIG. 7A is a fragmentary side sectional view of the same connector of FIG. 6A with working element and printed circuit board tightly connected thereto.
Figure 7B:
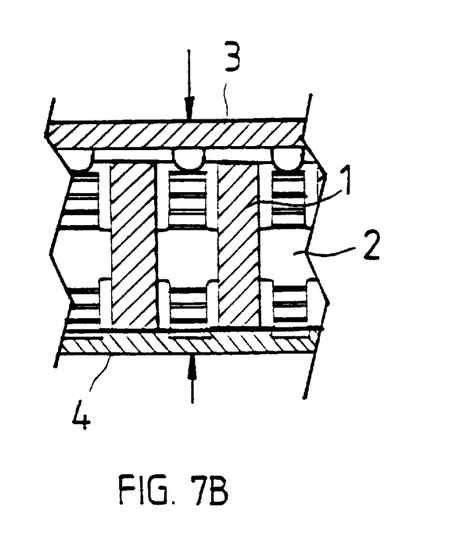
FIG. 7B is a fragmentary front sectional view of the same connector of FIG. 7A.

FIGS. 7A and 7B are similar to FIGS. 6A and 6B, respectively, but with the working element 3 and the printed circuit board 4 connected to the connector. When the working element 3 and the printed circuit board 4 are assembled to the connector, they apply two opposite forward pressures on the connector, as indicated by the arrows in the drawing, causing contacts 31 of the working element 3 to downward press against top ends of the upper elastic portions 22 and contacts 41 of the printed circuit board 4 to upward press against bottom ends of the lower elastic portions 23 to ensure good electric connection thereof.

The elastic portions 22 and 23 of each terminal 2 shown in FIGS. 6A are in a continuously bent configuration that allows the elastic portions 22 and 23 to be compressed into the terminal hole 11 when the working element 3 and the printed circuit board 4 are assembled to the connector, as shown in FIG. 7A. Therefore, no tin soldering is required in the LGA type connection to make the same superior to the conventional SMT and BGA type connections.

Figure 8A:
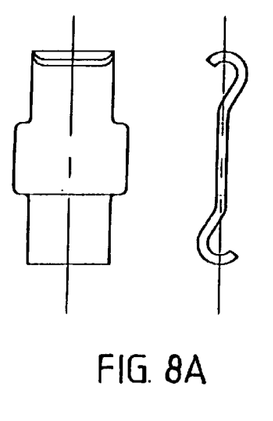
FIGS. 8A to 8D illustrate differently shaped terminals for the connector of the present invention, wherein the elastic portions of the terminals are of three dimensions.
Figure 8B:
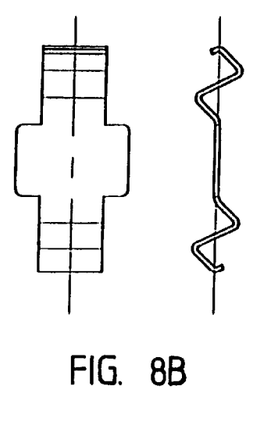
Figure 8C:
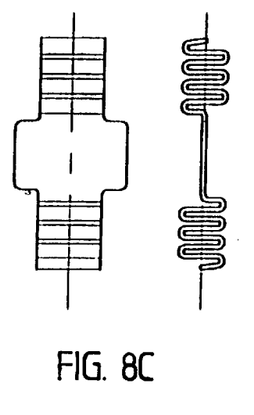
Figure 8D:
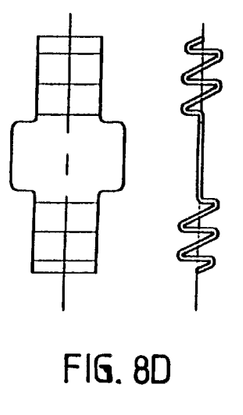

It is to be noted that the terminal 2 is not necessary to have the continuously bent shape as shown in FIG. 6A. Any other shape is acceptable so long as the elastic portions 22 and 23 of the terminal 2 can be axially compressed into the terminal hole 11 by the contact 31 and 41, respectively, under the forward pressures generated during assembling the working element 3 and the printed circuit board 4 to the connector. FIGS. 8A to 8D illustrate some acceptable examples of three-dimensional elastic portions 22, 23 for the terminals 2. The elastic portions 22, 23 may be two hook-shaped bodies as shown in FIG. 8A, two continuously angularly bent bodies as shown in FIG. 8B, two continuously curved bodies as shown in FIG. 8C, or two bodies in a shape similar to letter M as shown in FIG. 8D.

Figure 9A:
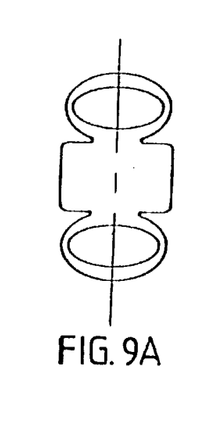
FIGS. 9A to 9I illustrate differently shaped terminals for the connector of the present invention, wherein the elastic portions of the terminals are of two dimensions.
Figure 9B:
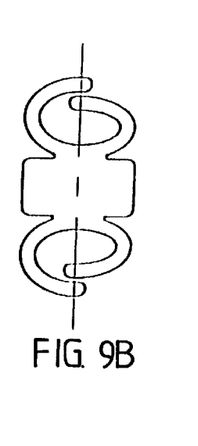
Figure 9C:
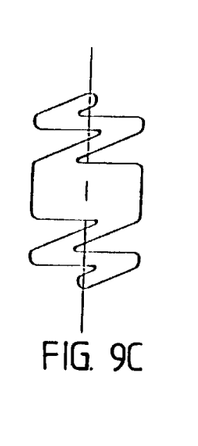
Figure 9D:
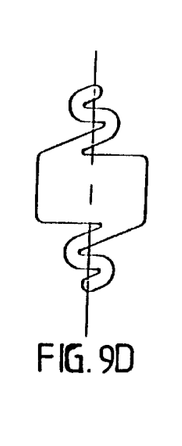
Figure 9E:
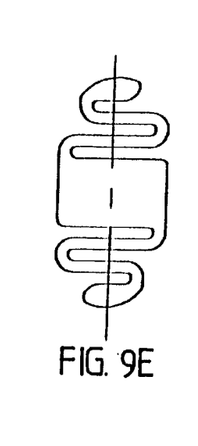
Figure 9F:
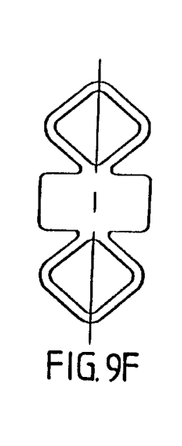
Figure 9G:
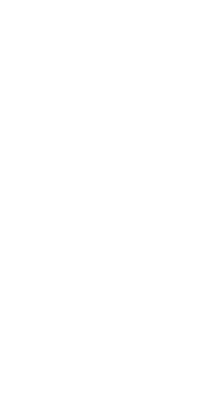
Figure 9H:
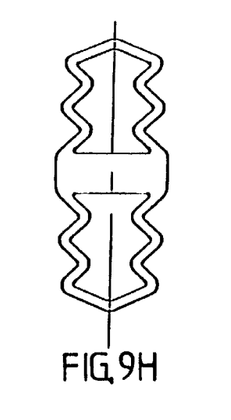
Figure 9I:
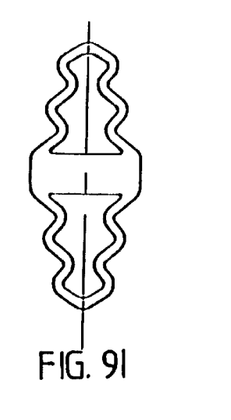

FIGS. 9A to 9I illustrate some acceptable examples of two-dimensional elastic portions 22, 23 for the terminals 2. The elastic portions 22, 23 may be two oblong loops as shown in FIG. 9A, two pairs of oppositely curved arms of different heights as shown in FIG. 9B, two oblique letters N as shown in FIG. 9C, two oblique letters N with reduced tops as shown in FIG. 9D, two pairs of two connected horizontal sections with curved ends and shortened curved tops as shown in FIG. 9E, two rhombic loops as shown in FIG. 9F, two loops separately formed from two connected rhombi as shown in FIG. 9G, two loops separately formed from two and a half connected rhombi as shown in FIG. 9H, or two loops separately formed from rhombi gradually narrowed from inner end to outer end as shown in FIG. 9I.

The working element 3 shown in FIG. 6A has contacts 31 of ball type C1 as that shown in FIG. 10A. However, the working element 3 may also have contacts 31 of plane type C2 as that shown in FIG. 10B to achieve the same effect.

With the above arrangements, the connector with LGA type terminals according to the present invention has the advantages of high-density pin layout and specially designed elastic portions for terminals to allow connection to working element without tin soldering. The connector of the present invention is therefore novel and practical for use.

What is claimed is:

1. A connector for connecting to a working element and a printed circuit board, comprising a plastic body having a plurality of terminal holes, and a plurality of terminals in the terminal holes to connect to contacts on said working element and said printed circuit board, wherein each of said terminals includes an upper elastic portion and a lower elastic portion both axially compressible in said terminal holes, said upper and said lower elastic portions of each said terminal are of two dimensions, and said elastic portions of each said terminal are two rhombic-shaped loops, and wherein said terminals are electrically connected to said contacts of said working element and of said printed circuit board without the need of tin soldering because two forward pressures are directly applied by said working element and said printed circuit board on said upper and said lower elastic portions of said terminals, respectively, when said working element and said printed circuit board are assembled to said plastic body of said connector.

2. A connector for connecting to a working element and a printed circuit board, comprising a plastic body having a plurality of terminal holes, and a plurality of terminals in the terminal holes to connect to contacts on said working element and said printed circuit board, wherein each of said terminals includes an upper elastic portion and a lower elastic portion both axially compressible in said terminal holes, said upper and said lower elastic portions of each said terminal are of two dimensions, and said elastic portions of each said terminal include two loops separately formed from two connected rhombi, and wherein said terminals are electrically connected to said contacts of said working element and of said printed circuit board without the need of tin soldering because two forward pressures are directly applied by said working element and said printed circuit board on said upper and said lower elastic portions of said terminals, respectively, when said working element and said printed circuit board are assembled to said plastic body of said connector.

3. A connector for connecting to a working element and a printed circuit board, comprising a plastic body having a plurality of terminal holes, and a plurality of terminals in the terminal holes to connect to contacts on said working element and said printed circuit board, wherein each of said terminals includes an upper elastic portion and a lower elastic portion both axially compressible in said terminal holes, said upper and said lower elastic portions of each said terminal are of two dimensions, and said elastic portions of each said terminal include two loops separately formed from two and a half connected rhombi, and wherein said terminals are electrically connected to said contacts of said working element and of said printed circuit board without the need of tin soldering because two forward pressures are directly applied by said working element and said printed circuit board on said upper and said lower elastic portions of said terminals, respectively, when said working element and said printed circuit board are assembled to said plastic body of said connector.

4. A connector as claimed in claim 3, wherein said rhombi forming said elastic portions of each of said terminal gradually narrow from inner to outer end of said elastic portions.

5. A terminal for use in a connector between a working element and a printed circuit board comprising:

a middle base; and a pair of upper and lower elastic portions respectively on opposite ends of the middle base, said upper and lower elastic portions having contact sections for respectively engaging with contacts of the working element and the printed circuit board, said upper and lower elastic portions being resiliently compressible along an axis of deflection extending through the middle base and the contact sections, and each of said upper and lower elastic portions having a pair of opposite side sections, each originating at the contact sections and terminating at an end section, wherein the pair of end sections of each elastic portion is integrally connected with the middle base without any interruption therebetween, whereby an integral and continuous loop is formed by the elastic portion.

6. The terminal as claimed in claim 5, wherein each of the upper and lower elastic portions forms a continuous, oblong loop.

* * * * *